US008891239B2

(12) United States Patent
Yu

(10) Patent No.: US 8,891,239 B2
(45) Date of Patent: Nov. 18, 2014

(54) SLIDE-COVER ELECTRONIC DEVICE

(71) Applicant: Wistron Corporation, New Taipei (TW)

(72) Inventor: Ching-Jen Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 203 days.

(21) Appl. No.: 13/726,426

(22) Filed: Dec. 24, 2012

(65) Prior Publication Data

US 2013/0286600 A1 Oct. 31, 2013

(30) Foreign Application Priority Data

Apr. 25, 2012 (TW) .............................. 101114796 A

(51) Int. Cl.
*G06F 1/16* (2006.01)
*H05K 5/02* (2006.01)

(52) U.S. Cl.
CPC ................................... *H05K 5/0217* (2013.01)
USPC ................... 361/679.58; 455/575.4; 345/177; 206/534.1

(58) Field of Classification Search
USPC ........ 206/534.1, 373, 305, 459.1, 459.5, 433, 206/531; 361/679.28, 679.01, 679.27, 361/679.55, 679.57, 679.56, 679.43, 361/679.09, 679.41, 679.05, 679.11, 361/679.25, 679.4, 679.02, 679.08, 679.39; 455/575.4, 566, 564, 575.8, 90.1, 455/575.3, 575.1; 312/311, 334.1, 333, 312/334.47, 319.1, 334.46, 223.1; 16/114.1, 113.1, 305, 327, 9
See application file for complete search history.

(56) References Cited

U.S. PATENT DOCUMENTS

| 6,404,622 | B1 * | 6/2002 | Chen ......................... 361/679.28 |
| 7,848,111 | B2 | 12/2010 | Tsai et al. |
| 2011/0317349 | A1 * | 12/2011 | Jang et al. ................. 361/679.01 |
| 2012/0077555 | A1 * | 3/2012 | Jung ........................... 455/575.4 |
| 2014/0111916 | A1 * | 4/2014 | Huang ...................... 361/679.01 |

FOREIGN PATENT DOCUMENTS

| TW | M245522 U | 10/2004 |
| TW | M250190 U | 11/2004 |
| TW | D128407 | 4/2009 |

* cited by examiner

*Primary Examiner* — Hung Duong
(74) *Attorney, Agent, or Firm* — Rabin & Berdo, P.C.

(57) ABSTRACT

A slide-cover electronic device includes a main body, a moveable body and a supporting assembly. The moveable body is combined with the main body to move linearly and rotate with respect to the main body. The supporting assembly is configured as a supporting structure protruding out of a back side of the main body with an included angle formed between the main body and the moveable body. The supporting assembly includes a rotating member, a first sliding member and a second sliding member. The rotating member is rotatably connected with the back side to lean on the back side or form an included angle in between. The first sliding member is movably connected with the rotating member to move linearly with respect to the rotating member. The second sliding member is movably connected with the moveable body for being clasped with the first sliding member in a second status.

16 Claims, 13 Drawing Sheets

SLIDE-COVER ELECTRONIC DEVICE

CROSS-REFERENCES TO RELATED APPLICATIONS

This non-provisional application claims priority under 35 U.S.C. §119(a) on Patent Application No. 101114796 filed in Taiwan, R.O.C. on 2012 Apr. 25, the entire contents of which are hereby incorporated by reference.

BACKGROUND

1. Technical Field

The disclosure relates to a slide-cover electronic device, in particular to a slide-cover electronic device with a supporting structure.

2. Related Art

The technologies of integrating a keyboard and a display as one and making the keyboard foldable onto the display, are broadly disclosed in the prior art. For example, TW Design Patent No. D128407, TW New Model Patent No. M245522 and TW New Model Patent No. M250190, each introduce a structure of folding the keyboard and foot stand(s) onto the display.

Aside from the above means of folding the keyboard onto the display, a slide-cover electronic device with cover-sliding and cover-lifting operations simultaneously, is another method to integrate the keyboard and the display. For example, a slide-cover electronic device introduced in U.S. Pat. No. 7,848,111 has a display unit stacked on a keyboard unit. When the display unit is moved with respect to the keyboard unit and moved to a certain position, the display unit is able to rotate with respect to the keyboard unit and operate in a way similar to cover-lifting operations, so that the display unit is able to stand up.

For the slide-cover electronic device mentioned above, the standing display unit is still possible to fall back down and fails to fix at the angle at which it originally stands. In order to fix and maintain the angle between the display unit and the keyboard, available solutions in the prior art mostly add friction or damping components in the pivotal structures between the display unit and the keyboard unit. However, such friction or damping components lose friction or damping function after repeated operations, and eventually fail to maintain the angle of the display unit.

Although the supporting structures introduced in TW Patents No. D128407, M245522 and M250190 are able to support the display unit, these supporting structures need the user to operate manually. If the user puts the slide-cover electronic device to stand on the table without adjusting the supporting structure, the display unit is possible to accidentally fall back down and seriously hit the table.

SUMMARY

For the slide-cover electronic devices in the prior art, after the display unit is rotated with respect to the keyboard unit to stand up, it is not easy to fix the standing angle, so the display is still prone to falling back down. Accordingly, according to embodiments of the disclosure, a slide-cover electronic device is introduced with an additional supporting structure.

In one or more embodiments of the disclosure, a slide-cover electronic device includes a main body, a moveable body and a supporting assembly.

The main body includes a front side and a back side. The moveable body is combined with the main body to move linearly and rotate with respect to the main body.

In a first status, the moveable body is mounted onto the back side; in a second status, the moveable body moves linearly with respect to the main body and reaches a rotating position; in a third status, the moveable body rotates with respect to the main body so that an included angle is formed between the main body and the moveable body.

The supporting assembly is configured as a supporting structure protruding out of the back side in the third status. The supporting assembly includes a rotating member, a first sliding member and a second sliding member.

The rotating member has an end rotatably connected with the back side of the main body to lean on the back side or form an included angle between the main body and the rotating member. The first sliding member is movably connected with the rotating member to move linearly with respect to the rotating member; wherein a clasping portion is formed on an end of the first sliding member. The second sliding member is movably connected with the moveable body; wherein a connecting portion is formed on an end of the second sliding member for being clasped with the clasping portion in the second status.

Through the slide-cover electronic device provided by the embodiments of the disclosure, the user needs only to push the main body to move and rotate with respect to the moveable body, without manually operating the supporting assembly to support the main body, thereby achieving a friendly operability for the slide-cover electronic device.

BRIEF DESCRIPTION OF THE DRAWINGS

The disclosure will become more fully understood from the detailed description given herein below for illustration only, and thus not limitative of the present invention, wherein.

DETAILED DESCRIPTION

Figure 1:
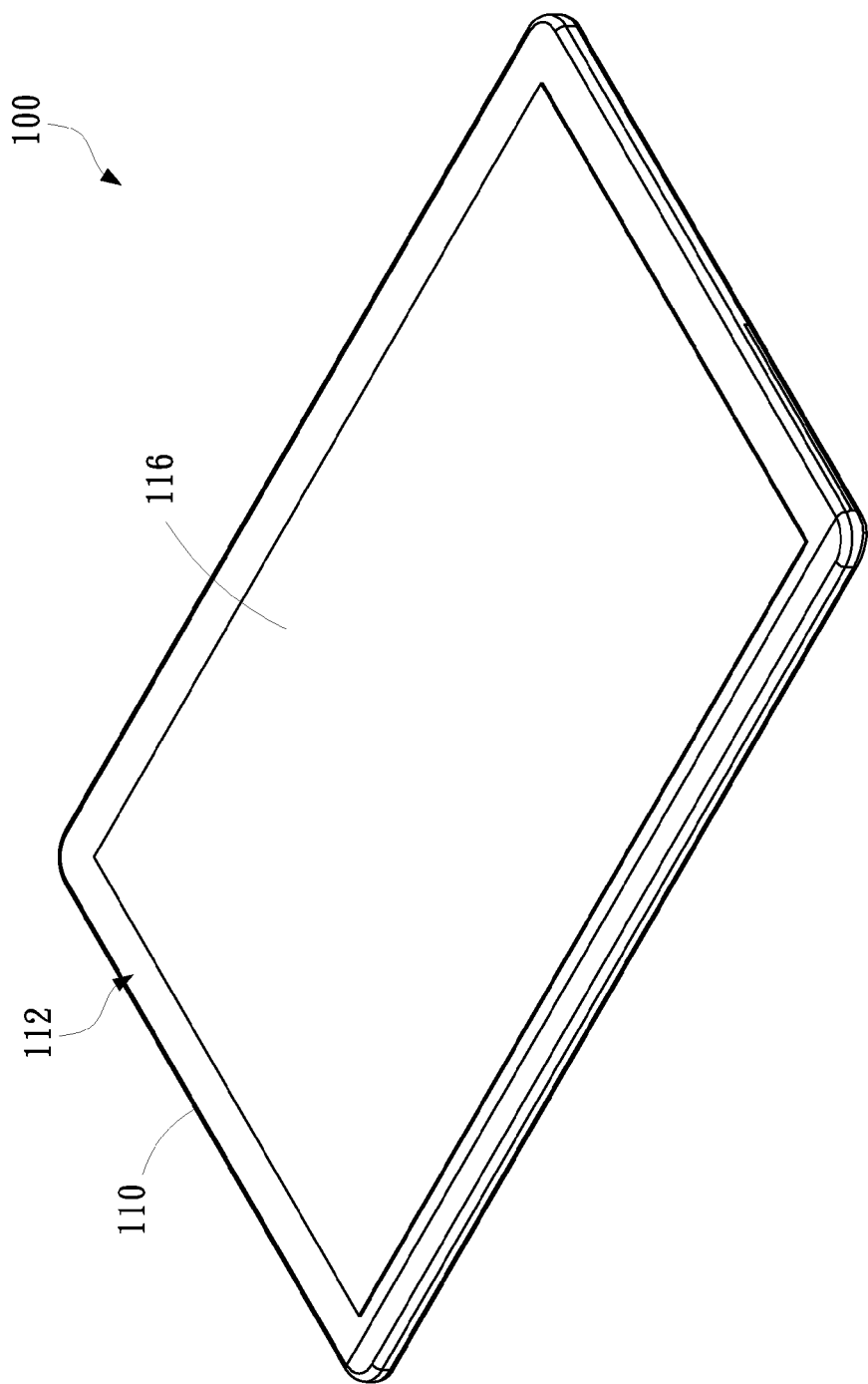
FIG. 1 is a perspective view (I) of a slide-cover electronic device according to an embodiment of the disclosure.
Figure 2:
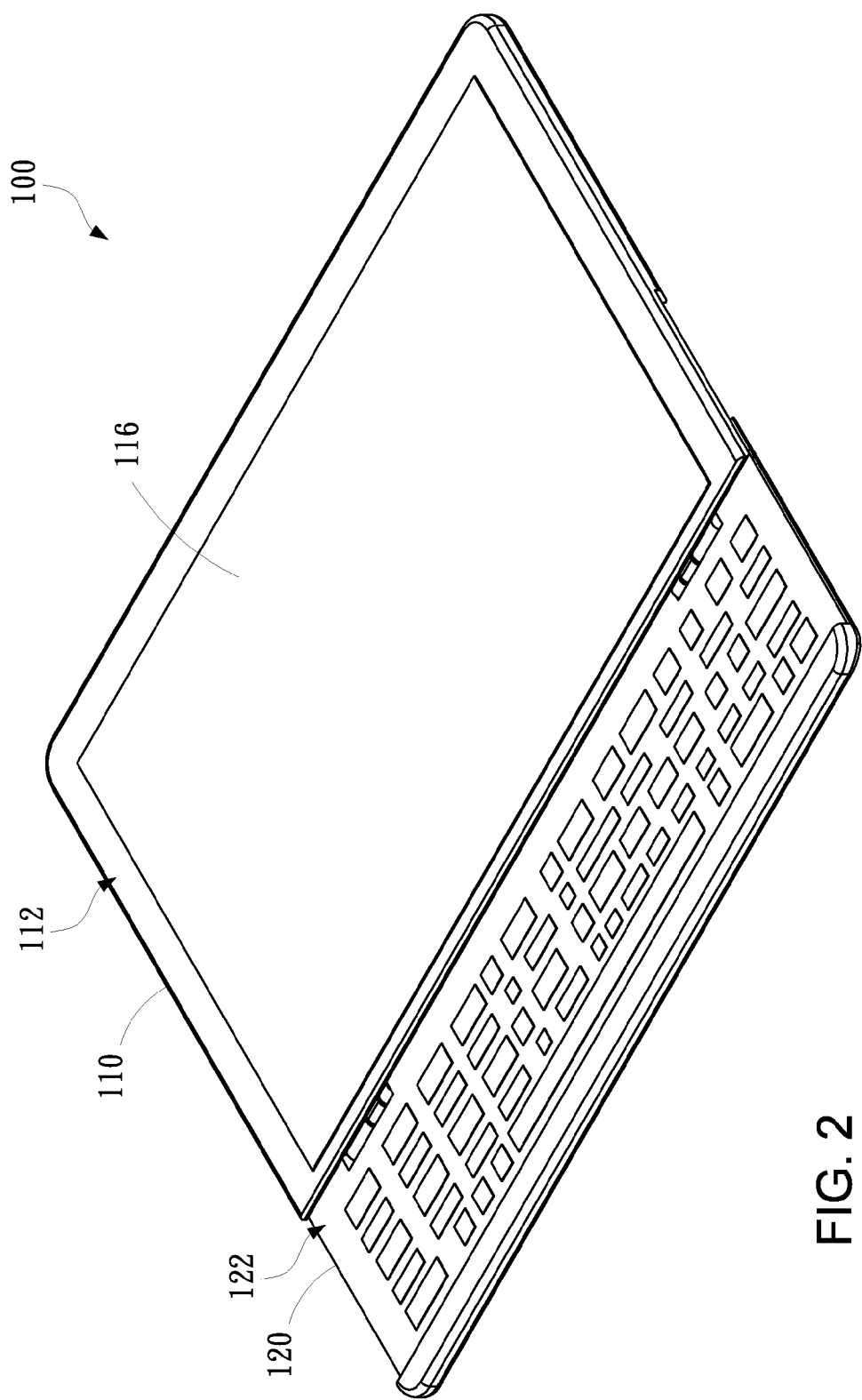
FIG. 2 is a perspective view (II) of a slide-cover electronic device according to an embodiment of the disclosure.
Figure 3:
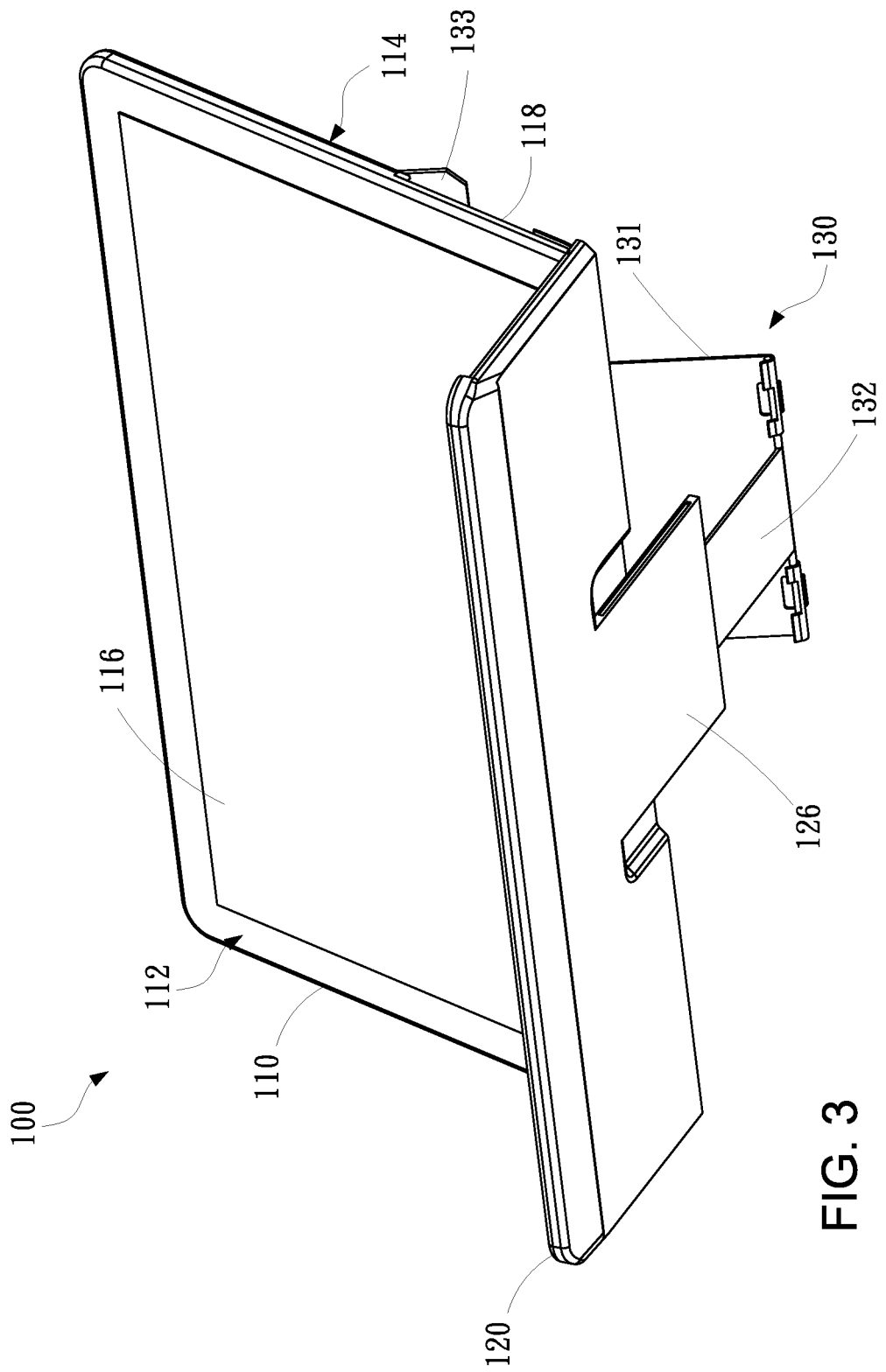
FIG. 3 is a perspective view (III) of a slide-cover electronic device according to an embodiment of the disclosure.

Please refer to FIG. 1, FIG. 2 and FIG. 3, which illustrate a slide-cover electronic device 100 according to embodiments of the disclosure. The slide-cover electronic device 100 includes a main body 110, a moveable body 120 and a supporting assembly 130.

As shown in FIG. 1, FIG. 2, FIG. 3 and FIG. 4, the main body 110 includes a front side 112 and a back side 114. The front side 112 has a display screen 116 configured thereon. At a side of the back side 114, a recessed accommodating portion 118 is formed to hold the moveable body 120.

As shown in FIG. 1, FIG. 2, FIG. 3 and FIG. 4, the moveable body 120 is combined with the main body 110 to move linearly and rotate with respect to the main body 110.

As shown in FIG. 1, in a first status, the moveable body 120 is located in the accommodating portion 118, and combined with the back side 114 of the main body 110.

As shown in FIG. 2, in a second status, the moveable body 120 moves linearly with respect to the main body 110, so as to separate from the accommodating portion 118, reach a rotating position and rotate with respect to the main body 110.

Figure 4:
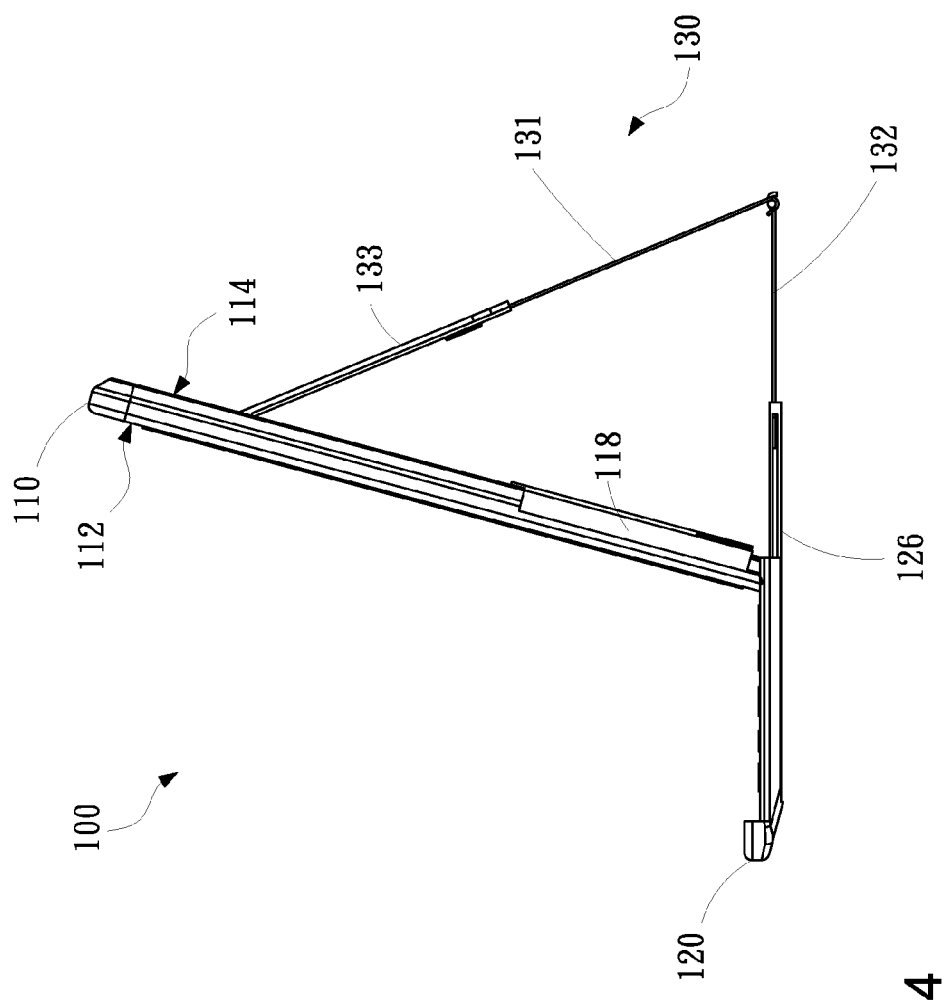
FIG. 4 is a side view of a slide-cover electronic device according to an embodiment of the disclosure.
Figure 5:
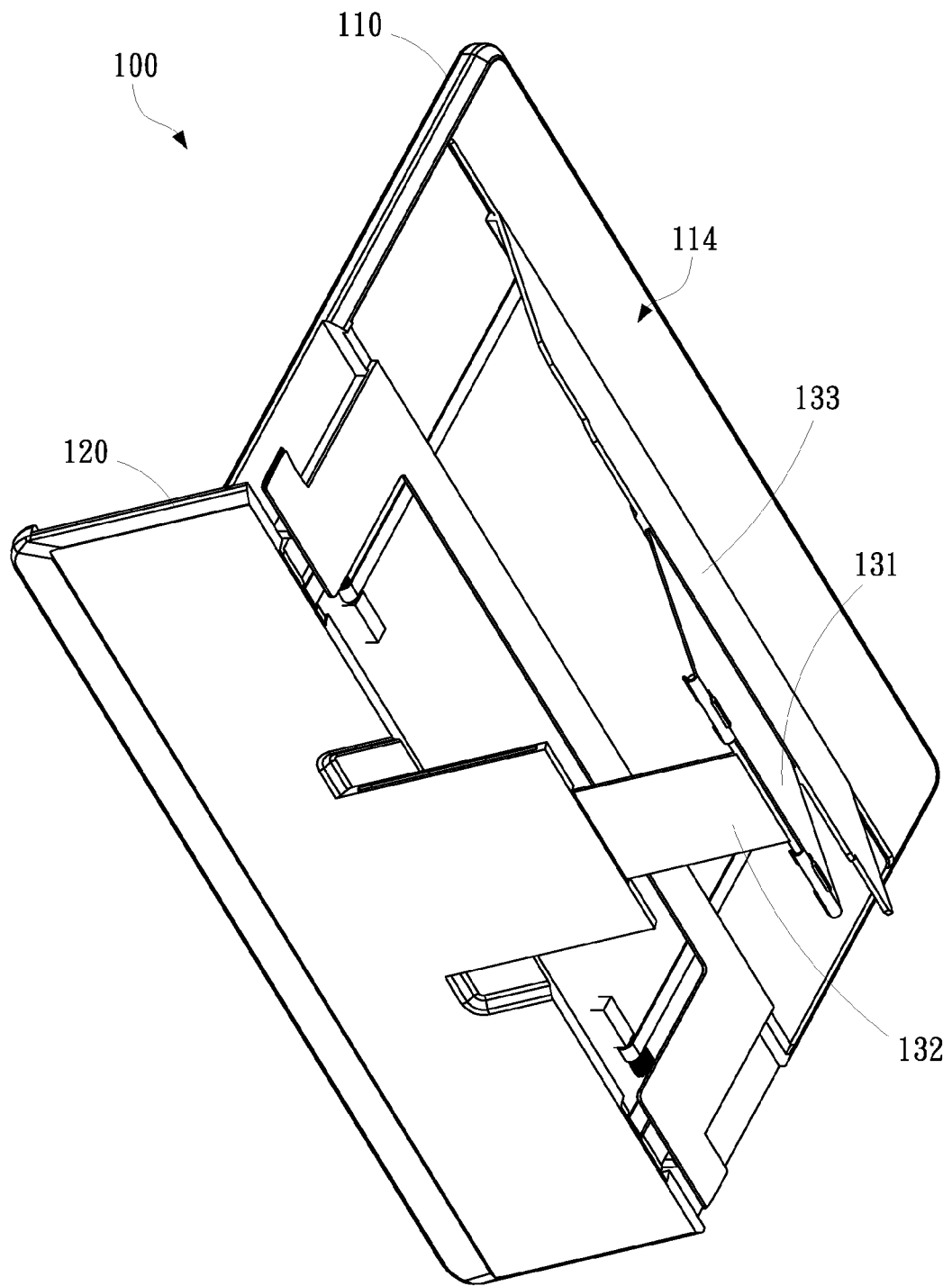
FIG. 5 is a perspective view (IV) of a slide-cover electronic device according to an embodiment of the disclosure.

As shown in FIG. 3, FIG. 4 and FIG. 5, in a third status, the moveable body 120 rotates with respect to the main body 110, so that an included angle is formed between the main body 110 and the moveable body 120.

furthermore, the moveable body 120 includes a top surface 122, and a button set is configured on the top surface 12 to make the moveable body 120 operable as a keyboard of the slide-cover electronic device 100. In the first status, the top surface 122 faces the back side 114 of the main body 110.

As shown in FIG. 3, FIG. 4 and FIG. 5, the supporting assembly 130 includes a rotating member 133, a first sliding member 131 and a second sliding member 132.

Figure 6:
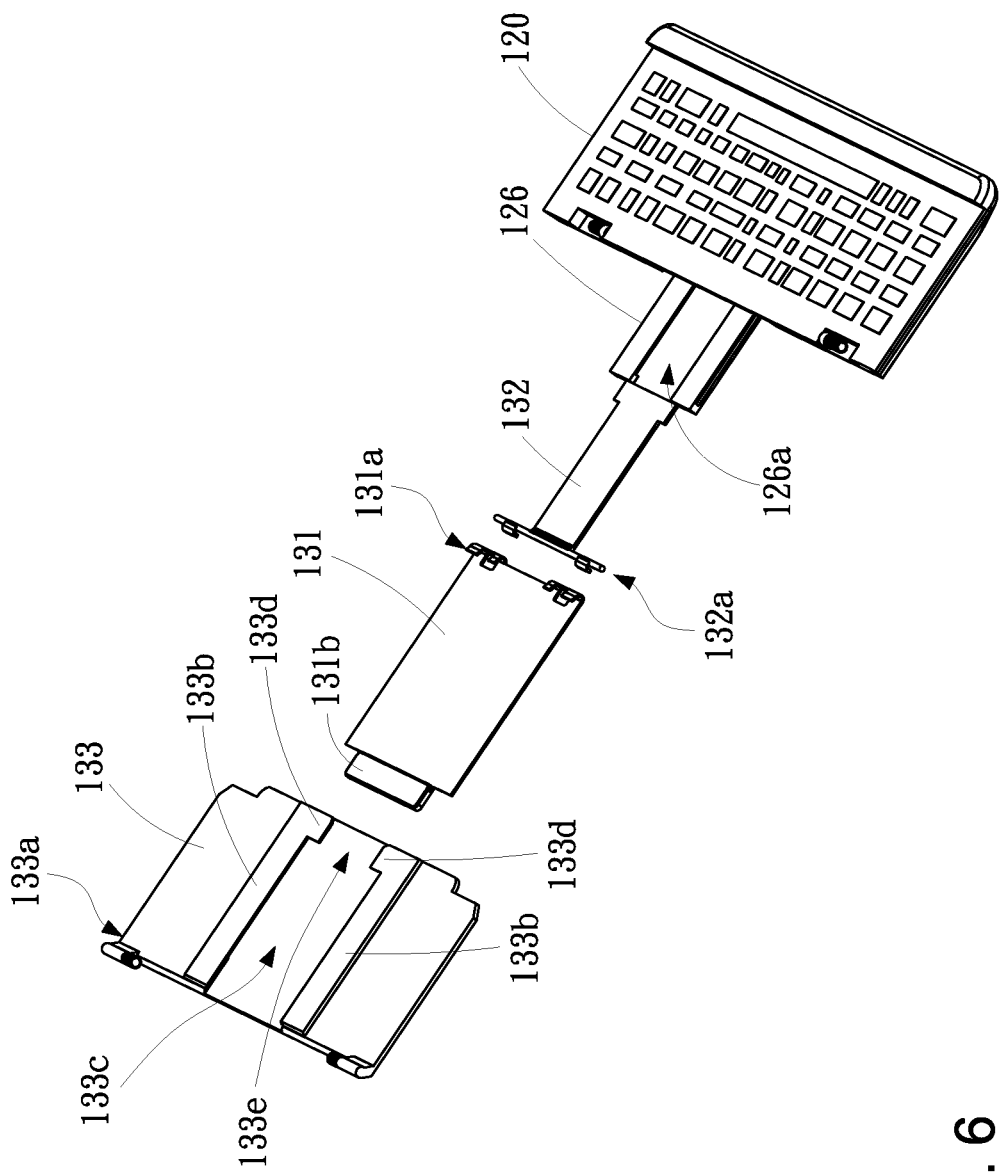
FIG. 6 is a perspective view (V) of partial components of a slide-cover electronic device according to an embodiment of the disclosure.
Figure 7:
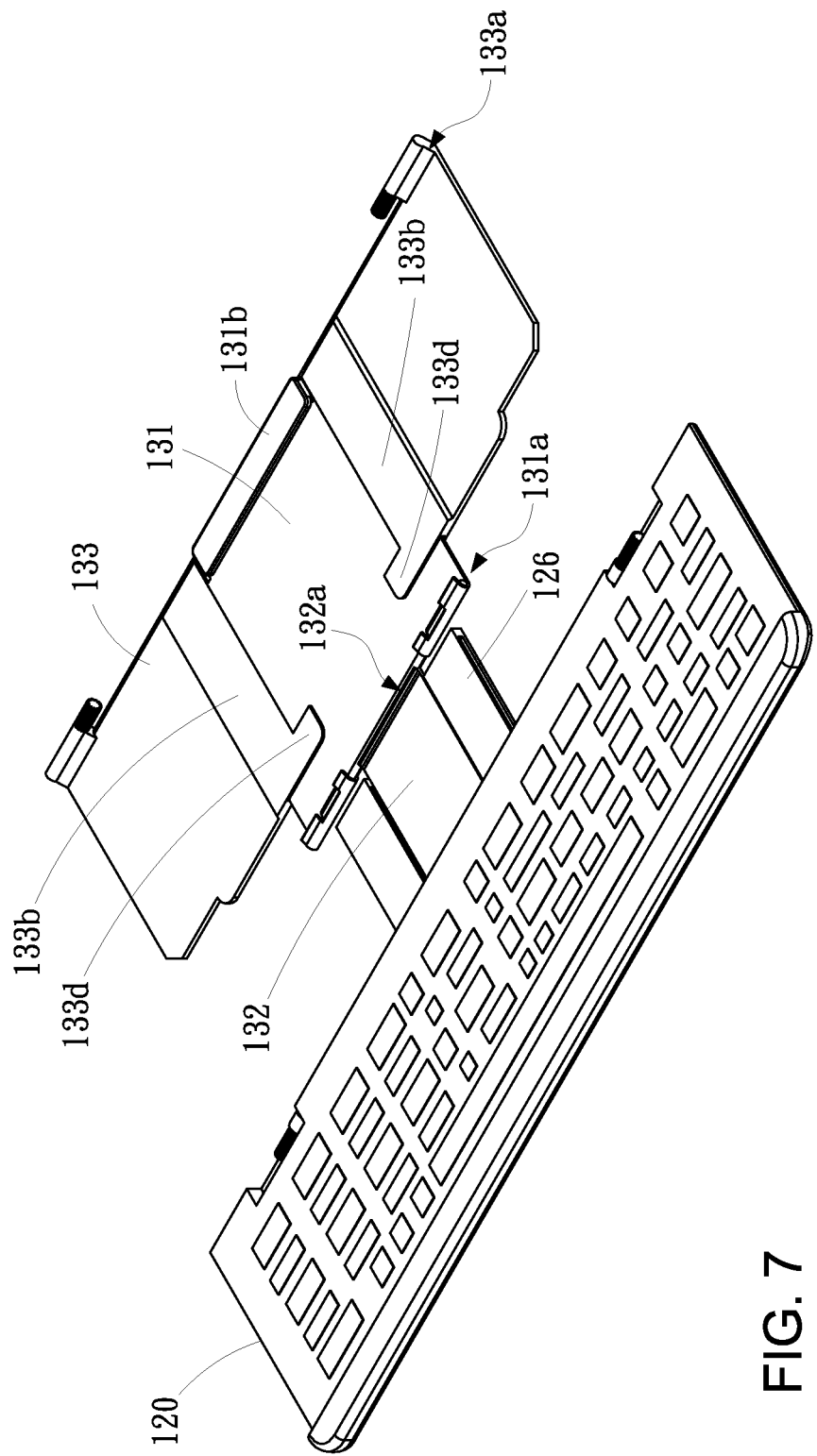
FIG. 7 is a perspective view (VI) of partial components of a slide-cover electronic device according to an embodiment of the disclosure.
Figure 8:
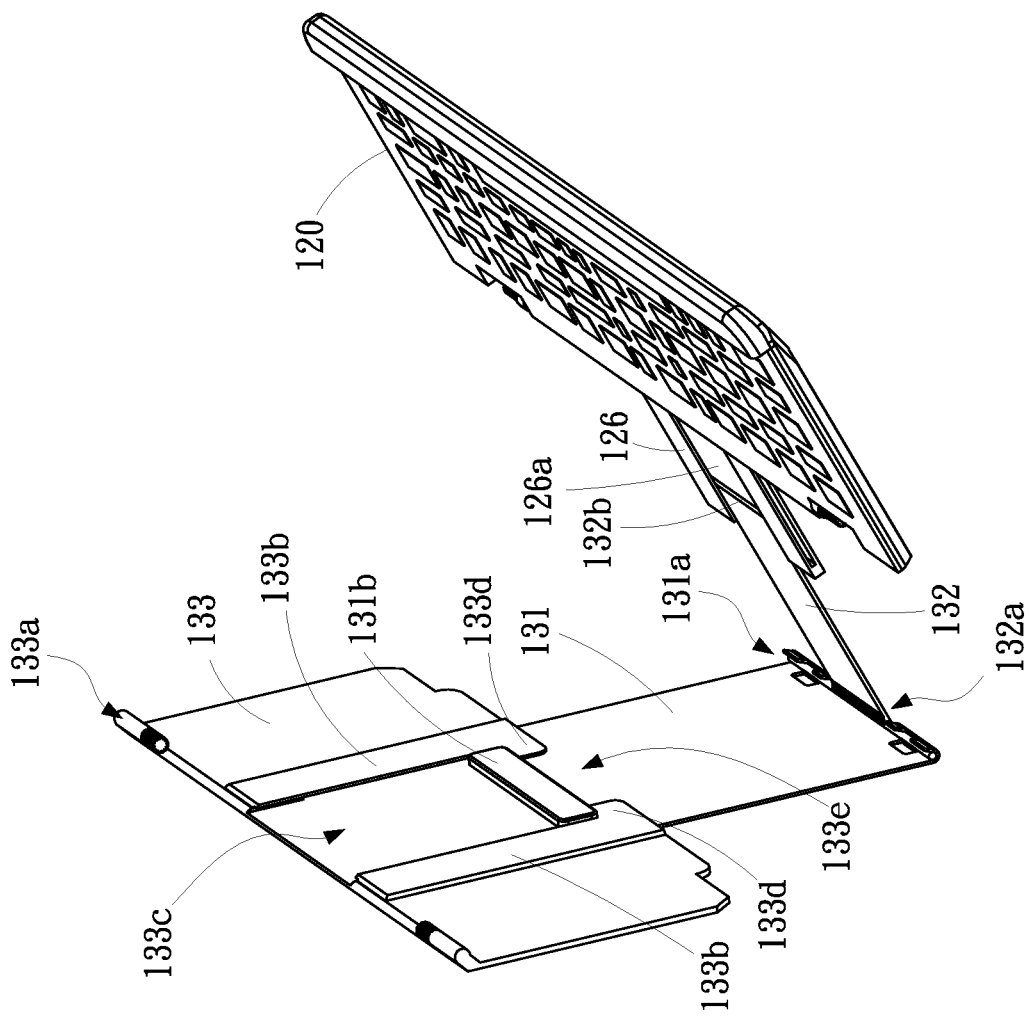
FIG. 8 is a perspective view (VII) of partial components of a slide-cover electronic device according to an embodiment of the disclosure.

Please jointly refer to FIG. 6, FIG. 7 and FIG. 8, the rotating member 133 is approximately plate-shaped. The rotating member 133 has a pivot end 133a. The pivot end 133a is rotatably connected with the back side 114 of the main body 110, so that the rotating member 133 is capable of rotating with respect to the main body 110 to lean onto the back side 114 of the main body 110, or to form an included angle between the main body 110 and the rotating member 133.

Figure 10:
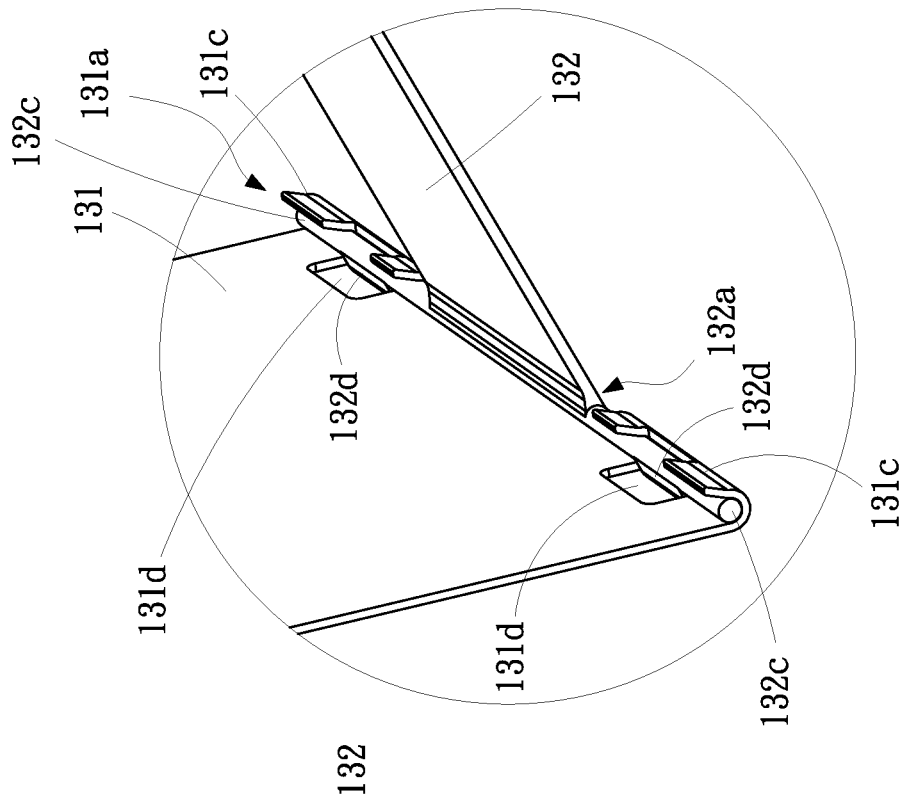
FIG. 10 is an enlarged view of partial components of a slide-cover electronic device according to an embodiment of the disclosure.
Figure 9:
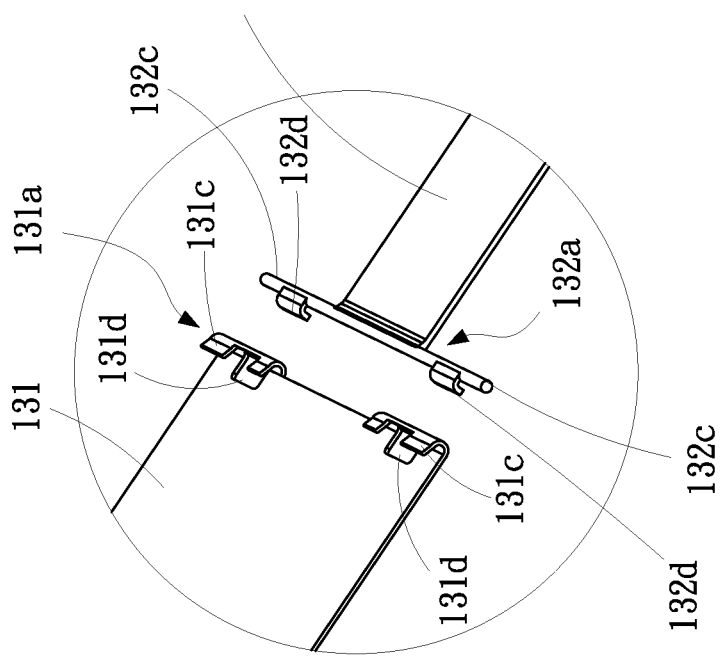
FIG. 9 is an enlarged view of partial components of a slide-cover electronic device according to an embodiment of the disclosure.

Please refer to FIG. 9 and FIG. 10 in combination, in which the first sliding member 131 is movably connected with the rotating member 133, so as to move linearly with respect to the rotating member 133. Moreover, the first sliding member 131 further includes a clasping portion 131a, formed at an end of the first sliding member 131. When the first sliding member 131 moves with respect to the rotating member 133, the clasping portion 131a is extended out of the rotating member 133. The second sliding member 132 is movably combined with the moveable body 120; the second sliding member 132 has a connecting portion 132a for being clasped with the clasping portion 131a.

As shown from FIG. 1 to FIG. 5, in the first status, the moveable body 120 is held inside the accommodating portion 118 of the main body 110, and in the meantime the rotating member 133, the first sliding member 131 and the second sliding member 132 are stacked with each other. In the second status, the moveable body 120 moves along a straight direction away from the main body 110 to separate from the accommodating portion 118. In addition, the second sliding member 132 is respectively moved with respect to the rotating member 133 and the first sliding member 131 firstly, until the clasping portion 131a clasps the connecting portion 132a and establishes a temporary connection between the first sliding member 131 and the second sliding member 132, thereby driving the first sliding member 131 to move linearly with respect to the rotating member 133. In the third status, the moveable body 120 rotates with respect to the main body 110, so that by the connection of the clasping portion 131a and the connecting portion 132a, and through the linking of the first sliding member 131, the second sliding member 132 is able to drive the rotating member 133 to rotate with respect to the main body 110, and to make the clasping portion 131a and the connecting portion 132a move along a direction away from the back side 114 of the main body 110.

As shown in FIG. 3, FIG. 4 and FIG. 5, in the third status, the rotating member 133, the first sliding member 131 and the second sliding member 132 of the supporting assembly 130 forms a supporting structure protruding out of the back side 114 of the main body 110. When the moveable body 120 is laid down on a plane, at a portion of the supporting assembly 130, for example a side surface of the second sliding member 132, the clasping portion 131a and the connecting portion 132a is simultaneously disposed on the plane, so as to support the main body 110 to stand on the plane and avoid the main body 110 from falling down to the plane.

As shown in FIG. 6, FIG. 7 and FIG. 8, in some practical embodiments, the rotating member 133 includes two L-shaped holding plates 133b, each disposed on a side surface of the rotating member 133 with an interval distance to the rotating member 133 main body, so that a the first sliding passage 133c is formed on the side surface of the rotating member 133 to hold the first sliding member 131 therein. Therefore, the first sliding member 131 is able to be movably disposed on the rotating member 133. Two hook ends 133d of the two L-shaped holding plates 133b are spaced and opposite to each other, so that the end of the first sliding passage 133c has a shrunk opening 133e with narrower width. The first sliding member 131 further includes a first stopping portion 131b disposed with respect to the clasping portion 131a, and the first stopping portion 131b and the clasping portion 131a are located outside two ends of the first sliding passage 133c respectively. The width of the first stopping portion 131b is greater than the width of the aforesaid shrunk opening 133e, so that the first stopping portion 131b is able to block at an end of the first sliding passage 133c, and the first sliding member 131 does not completely separate from the first sliding passage 133c.

Similarly, the moveable body 120 further includes an extending portion 126, protruding out of a side of the moveable body 120. And a second sliding passage 126a is formed in the extending portion 126 to hold the second sliding member 132. The second sliding member 132 further includes a second stopping portion 132b located in the moveable body 120 and disposed with respect to the connecting portion 132a. The width of the second stopping portion 132b is greater than the width of the second sliding passage 126a, so that the second stopping portion 132b is able to block at an end of the second sliding passage 126a and the second sliding member 132 does not completely separate away from the second sliding passage 126a. Furthermore, the allocation of the second sliding member 132 and the second sliding passage 126a may be similar to the above design of the first sliding member 131 and the first sliding passage 133c.

As shown in FIG. 9 and FIG. 10, the clasping portion 131a includes two first hooks 131c, and the connecting portion 132a includes two engaging shafts 132c respectively corresponding to the first hooks 131c. In the second status, each of the first hooks 131c respectively hooks a corresponding engaging shaft 132c, so that the clasping portion 131a clasps the connecting portion 132a, and drives the second sliding member 132 to move outwardly from the moveable body 120. In a practical embodiment, two clasping holes 131d are formed on the clasping portion 131a, while the connecting portion 132a further includes two second hooks 132d respectively corresponding to the clasping holes 131d. In the third status, each of the second hooks 132d respectively hooks a corresponding clasping hole 131d, to enhance the connection strength between the clasping portion 131a and the connecting portion 132a.

Figure 11:
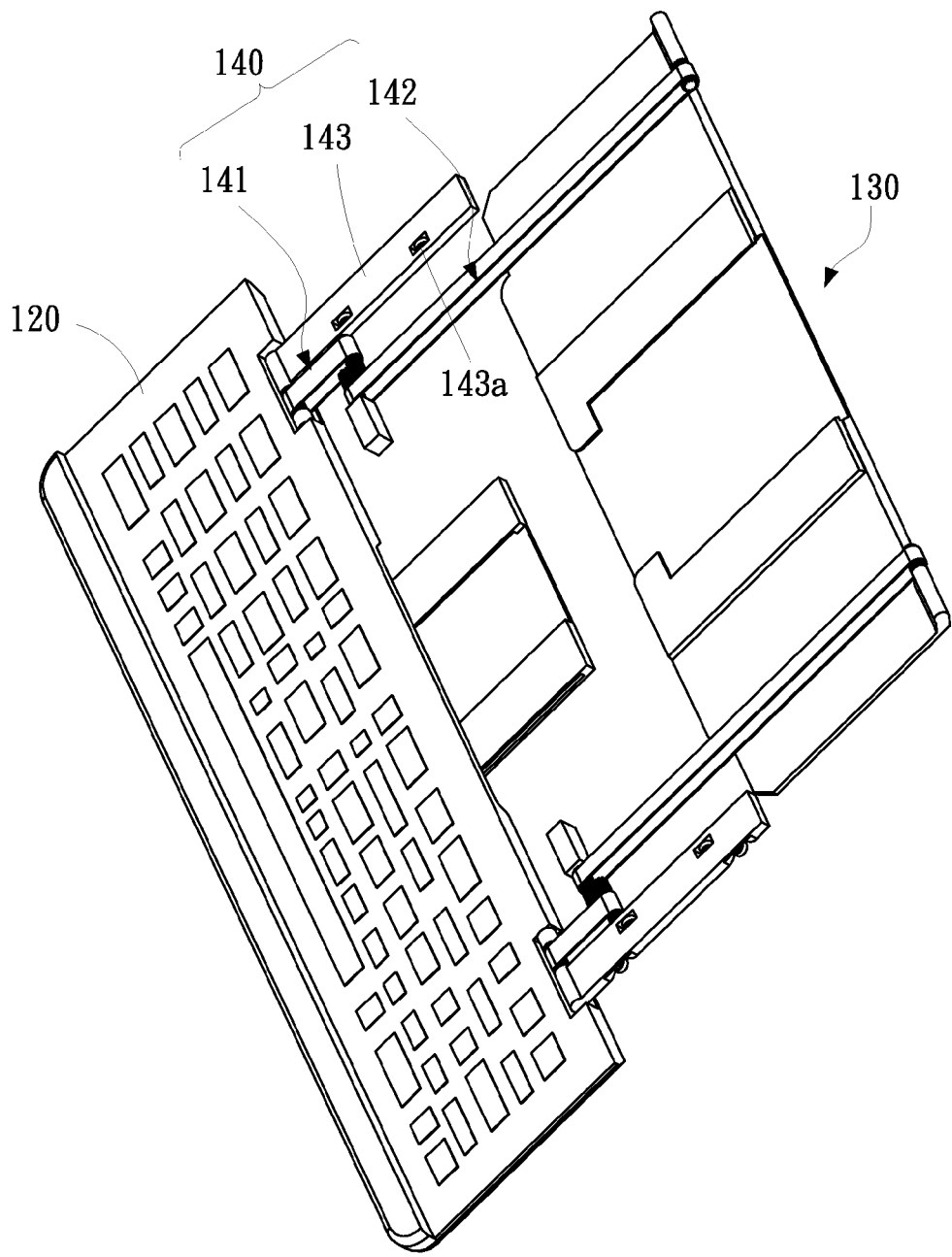
FIG. 11 is a perspective view (VIII) of partial components of a slide-cover electronic device according to an embodiment of the disclosure.
Figure 12:
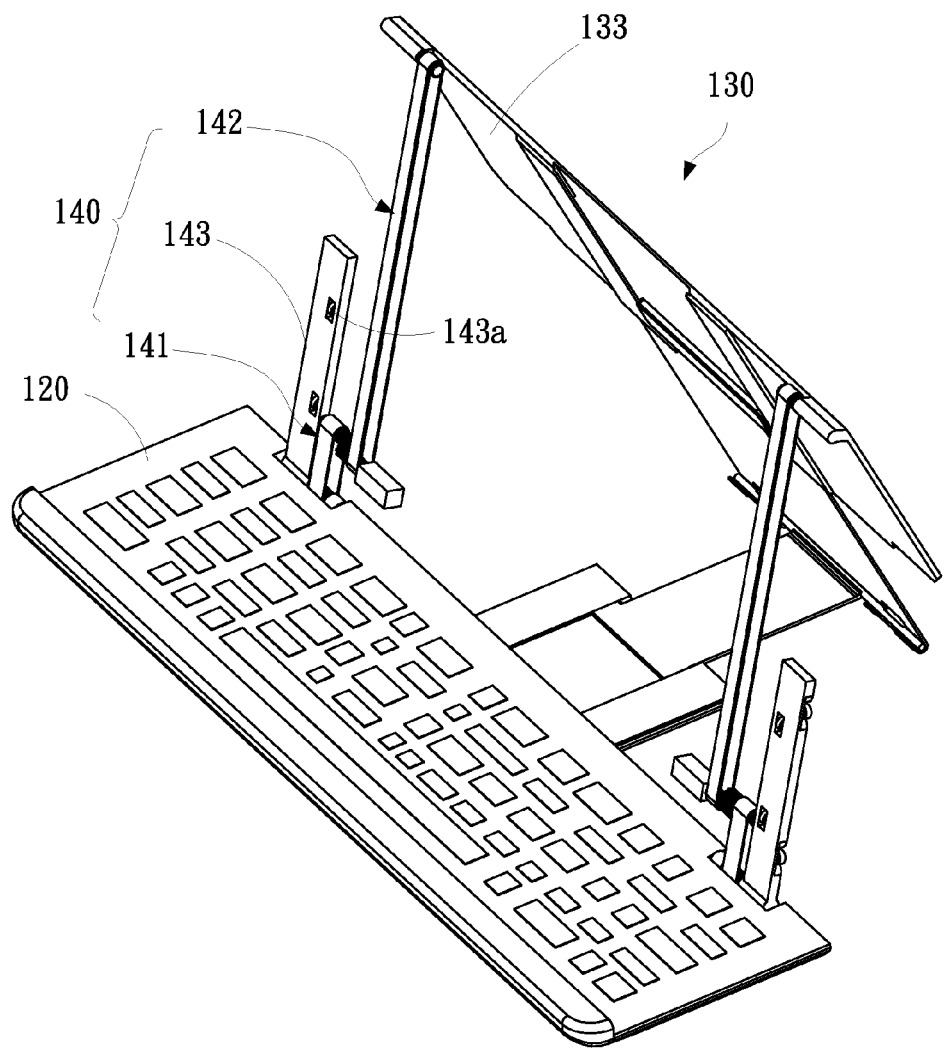
FIG. 12 is a perspective view (IX) of partial components of a slide-cover electronic device according to an embodiment of the disclosure.

Please refer to FIG. 11 and FIG. 12, in which a slide-cover electronic device 100 according to another embodiment further includes at least a linking assembly 140 to link the main body 110, the moveable body 120 and the supporting assembly 130. In a practical embodiment, the slide-cover electronic device 100 includes two linking assembles 140; a selected linking assembly 140 is further introduced in the following.

As shown in FIG. 11 and FIG. 12, the linking assembly 140 includes a sliding block 143, a first transmission set 141 and a second transmission set 142.

The sliding block 143 is movable disposed in the main body 110, with an end of the sliding block 143 pivotally configured on the moveable body 120, so that the moveable body 120 is movably and rotatably combined with the main body 110. Several gears 143a are able to be configured on the surface of the sliding block 143, so as to reduce the frictions between the sliding block 143 and the main body 110. The first transmission set 141 connects sliding block 143, and the second transmission set 142 connects the first transmission set 141 and the rotating member 133. The first transmission set 141 and the second transmission set 142 transfer the rotation of the sliding block 143 with respect to the moveable body 120, to drive the rotating member 133 to rotate with respect to the main body 110.

Figure 13:
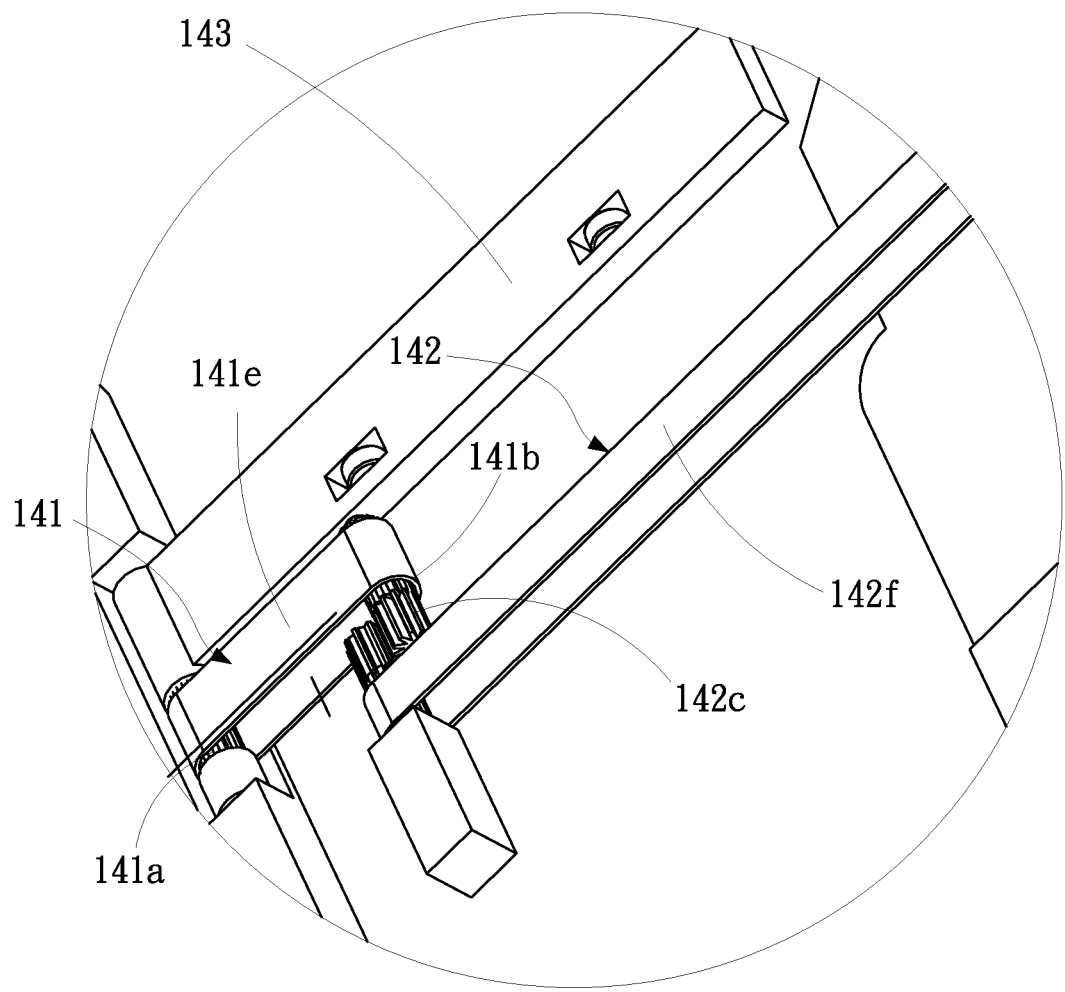
FIG. 13 is an enlarged view of partial components of a slide-cover electronic device according to an embodiment of the disclosure.
Figure 14:
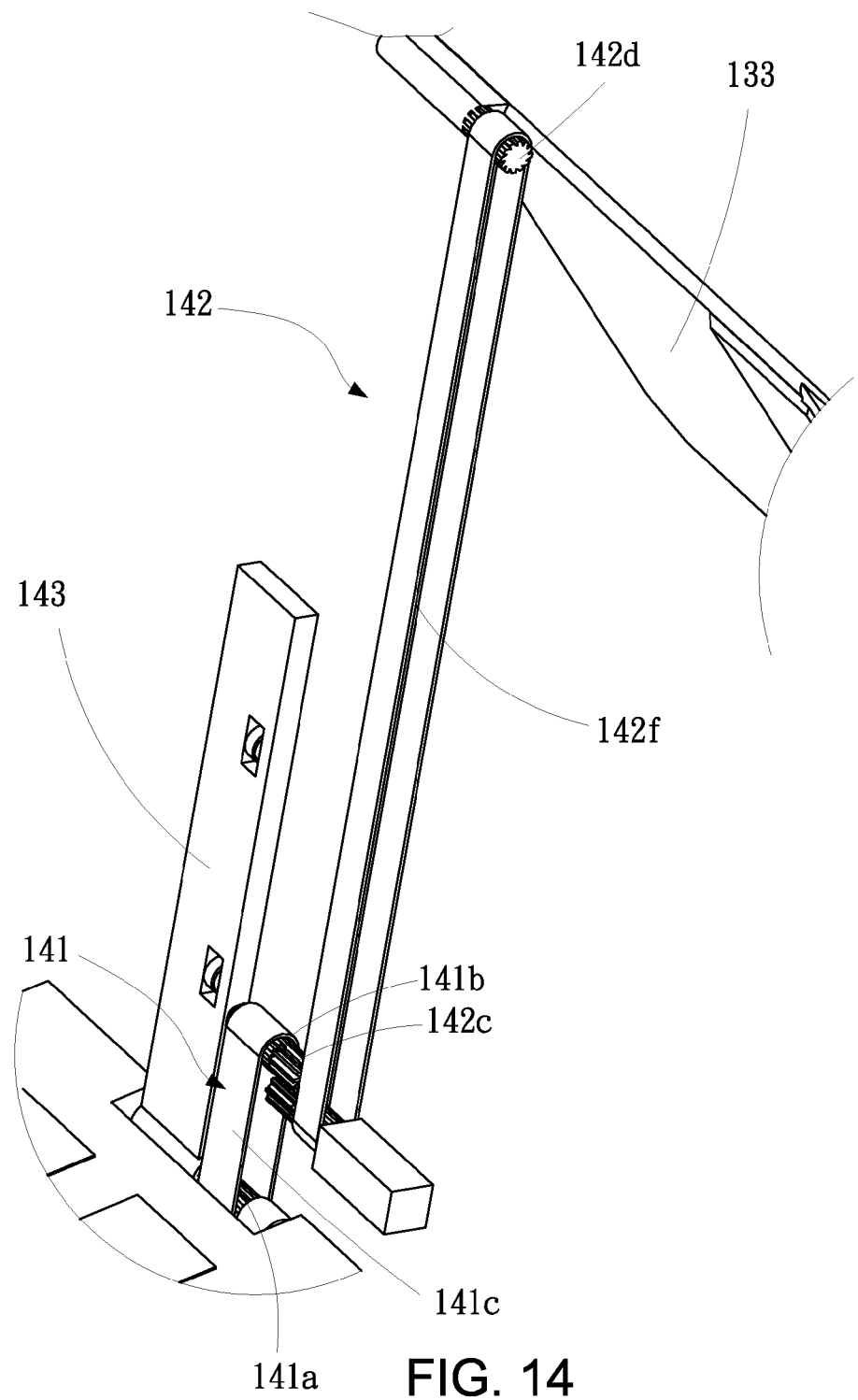
FIG. 14 is an enlarged view of partial components of a slide-cover electronic device according to an embodiment of the disclosure.

As shown in FIG. 13 and FIG. 14, the first transmission set 141 includes a first gear member 141a and a second gear member 141b linking with each other. The first gear member 141a is fastened on the sliding block 143, and the first gear member 141a and the sliding block 143 rotate coaxially. In a practical embodiment, the first transmission set 141 further includes a first transmission belt 141e to connect the first gear member 141a and the second gear member 141b, and the second gear member 141b is pivotally configured on a side surface of the sliding block 143.

The second transmission set 142 includes a third gear member 142c and a fourth gear member 142d linking with each other. The third gear member 142c engages with the second gear member 141b in the second status and the third status. The fourth gear member 142d is fastened on the rotating member 133, and the fourth gear member 142d and the rotating member 133 rotate coaxially. In a practical embodiment, the second transmission set 142 further includes a second transmission belt 142f to connect the third gear member 142c and the fourth gear member 142d.

In the second status, the moveable body 120 moves along a straight direction to separate from the accommodating portion 118. In the meantime, the first transmission set 141 is moved along with the moveable body 120 with the second gear member 141b engaging with the third gear member 142c.

When transferring from the second status to the third status, since the sliding block 143 is still located in the main body 110 and incapable of rotating with respect to the main body 110, the sliding block 143 does not drive the first gear member 141a to rotate with respect to the moveable body 120. At the moment, through the first gear member 141a, the second gear member 141b is able to be driven to rotate and sequently drive the third gear member 142c and the fourth gear member 142d to rotate accordingly; then the rotating member 133 is driven to rotate and move the clasping portion 131a along a direction away from the back side 114 of the main body 110, so that the rotating member 133, the first sliding member 131 and the second sliding member 132 of the supporting assembly 130 are able to form a supporting structure protruding out of the back side 114 of the main body 110.

In a practical embodiment, the rotating member 133, the first gear member 141a, the second gear member 141b, the third gear member 142c and the fourth gear member 142d may have the rotating angle relationships as follows. The first gear member 141a, the second gear member 141b and the third gear member 142c may have the same rotating angle, while a rotating angle of the fourth gear member 142d is twice of said same rotating angle. Therefore, when the moveable body 120 rotates an A angle with respect to the main body 110, by linking connections with the fourth gear member 142d, the rotating member 133 is able to rotate a 2A angle with respect to the main body 110. Namely, through the connections of the linking assembly 140, the rotating angle of the rotating member 133 with respect to the main body 110, is twice of the rotating angle of the moveable body 120 with respect to the main body 110.

The linking assembly 140, upon the rotation of the moveable body 120 with respect to the main body 110, is able to drive the supporting assembly 130, including the rotating member 133, the first sliding member 131 and the second sliding member 132 of the supporting assembly 130, to a position capable of supporting the main body 110. Additional manually adjusting operations on the supporting assembly 130 are not required for the user.

Through the slide-cover electronic device 100 provided by the embodiments of the disclosure, the user only needs to push the main body 110 to move with respect to the moveable body 120, without manually operating the supporting assembly 130 to support the main body, thereby achieving a friendly operability for the slide-cover electronic device.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:
1. A slide-cover electronic device, comprising:
a main body, having a front side and a back side;
a moveable body, combined with the main body to move linearly and rotate with respect to the main body; wherein, in a first status the moveable body is mounted onto the back side, in a second status the moveable body moves linearly with respect to the main body and reaches a rotating position, and in a third status the moveable body rotates with respect to the main body so that an comprised angle is formed between the main body and the moveable body; and
a supporting assembly, configured as a supporting structure protruding out of the back side of the main body in the third status, the supporting assembly comprising:
a rotating member, having an end rotatably connected with the back side of the main body to lean on the back side or form an comprised angle between the main body and the rotating member;

a first sliding member, movably connected with the rotating member to move linearly with respect to the rotating member; wherein a clasping portion is formed on an end of the first sliding member; and a second sliding member, movably connected with the moveable body; wherein a connecting portion is formed on an end of the second sliding member for being clasped with the clasping portion in the second status and establishing a temporary connection with the first sliding member.

2. The slide-cover electronic device according to claim 1, wherein an recessed accommodating portion is formed at a side of the back side to accommodate the moveable body in the first status, and in the second status the moveable body moves away from the main body to separate from the accommodating portion.

3. The slide-cover electronic device according to claim 1, wherein in the first status the rotating member, the first sliding member and the second sliding member are stacked with each other, and in the second status the second sliding member moves with respect to the rotating member and the first sliding member respectively with the clasping portion clasping at the connecting portion, so that the first sliding member and the second sliding member establish the temporary connection and drive the first sliding member to move linearly with respect to the rotating member.

4. The slide-cover electronic device according to claim 3, wherein the rotating member comprises two holding plates, each disposed at a side surface of the rotating member with an interval distance to the rotating member, so that a first sliding passage is formed on the side surface of the rotating member to accommodate the first sliding member therein.

5. The slide-cover electronic device according to claim 4, wherein the first sliding member further comprises a first stopping portion disposed opposite to the clasping portion, and the first stopping portion and the clasping portion are located outside two ends of the first sliding passage respectively; the first stopping portion is adapted to block at an end of the first sliding passage.

6. The slide-cover electronic device according to claim 5, wherein a hook end is formed at an end of each of the holding plates, so that the first sliding passage has a shrunk opening with a narrower width formed at the hook end, and the width of the first stopping portion is greater than the width of the shrunk opening.

7. The slide-cover electronic device according to claim 3, wherein the moveable body further comprises an extending portion protruding out of a side of the moveable body, and a second sliding passage is formed in the extending portion to accommodate the second sliding member.

8. The slide-cover electronic device according to claim 7, wherein the second sliding member further comprises a second stopping portion located in the moveable body to block at an end of the second sliding passage.

9. The slide-cover electronic device according to claim 8, wherein the width of the second stopping portion is greater than the width of the second sliding passage.

10. The slide-cover electronic device according to claim 1, wherein the clasping portion comprises at least a first hook, while the connecting portion comprises at least an engaging shaft; in the second status the first hook hooks the engaging shaft so that the clasping portion clasps on the connecting portion.

11. The slide-cover electronic device according to claim 1, wherein at least a clasping hole is formed on the clasping portion and the connecting portion further comprises at least a second hook; in the third status the second hook hooks into the clasping hole.

12. The slide-cover electronic device according to claim 1 further comprising at least a linking assembly to link the main body, the moveable body and the supporting assembly, wherein the linking assembly comprises:

a sliding block, movably disposed in the main body, an end of the sliding block is pivotally configured on the moveable body;

a first transmission set, connecting the sliding block; and a second transmission set, connecting the first transmission set and the rotating member;

wherein the first transmission set and the second transmission set transfer the rotation of the sliding block with respect to the moveable body, to drive the rotating member to rotate with respect to the main body.

13. The slide-cover electronic device according to claim 12, wherein:

the first transmission set comprises a first gear member and a second gear member linking with each other, the first gear member is fastened on the sliding block, and the first gear member and the sliding block rotate coaxially; and the second transmission set comprises a third gear member and a fourth gear member linking with each other, the third gear member engages with the second gear member in the second status and the third status, the fourth gear member is fastened on the rotating member, and the fourth gear member and the rotating member rotate coaxially.

14. The slide-cover electronic device according to claim 13, wherein:

the first transmission set further comprises a first transmission belt to connect the first gear member and the second gear member, and the second gear member is pivotally configured on a side surface of the sliding block; and the second transmission set further comprises a second transmission belt to connect the third gear member and the fourth gear member.

15. The slide-cover electronic device according to claim 14, wherein:

the first gear member, the second gear member, and the third gear member have a same rotating angle, and a rotating angle of the fourth gear member is twice of said same rotating angle.

16. The slide-cover electronic device according to claim 13, wherein:

a rotating angle of the rotating member with respect to the main body is twice of a rotating angle of the moveable body with respect to the main body.

* * * * *